United States Patent
Saunders

(10) Patent No.: US 8,044,845 B2
(45) Date of Patent: Oct. 25, 2011

(54) HIGHLY INTEGRATED CIRCUIT ARCHITECTURE

(75) Inventor: David R Saunders, Scottsdale, AZ (US)

(73) Assignee: ViaSat, Inc., Carlsbad, CA (US)

( * ) Notice: Subject to any disclaimer, the term of this patent is extended or adjusted under 35 U.S.C. 154(b) by 352 days.

(21) Appl. No.: 12/363,412

(22) Filed: Jan. 30, 2009

(65) Prior Publication Data

US 2009/0195440 A1 Aug. 6, 2009

Related U.S. Application Data

(60) Provisional application No. 61/025,559, filed on Feb. 1, 2008.

(51) Int. Cl.
*G01S 7/28* (2006.01)
(52) U.S. Cl. .......................... 342/175; 342/70
(58) Field of Classification Search .............. 342/70–72, 342/175, 98–103, 131–132, 134, 202
See application file for complete search history.

(56) References Cited

U.S. PATENT DOCUMENTS

| | | | | |
|---|---|---|---|---|
| 3,452,300 A | * | 6/1969 | Cappucci et al. | 333/112 |
| 3,618,091 A | * | 11/1971 | Butler | 342/149 |
| 3,803,514 A | * | 4/1974 | Camp, Jr. | 331/107 G |
| 4,677,394 A | | 6/1987 | Vollmer | |
| 4,791,421 A | * | 12/1988 | Morse et al. | 342/368 |
| 5,262,957 A | | 11/1993 | Hearn | |
| 6,130,640 A | | 10/2000 | Uematsu et al. | |
| 6,549,078 B1 | | 4/2003 | Sridharan | |
| 6,591,091 B1 | * | 7/2003 | Vorenkamp et al. | 455/179.1 |
| 7,566,296 B2 | * | 7/2009 | Zimmerling et al. | 600/25 |
| 7,573,420 B2 | | 8/2009 | Forstner et al. | |
| 2003/0067359 A1 | * | 4/2003 | Darabi et al. | 331/46 |
| 2004/0160286 A1 | * | 8/2004 | Ward et al. | 331/185 |
| 2004/0166804 A1 | * | 8/2004 | Moloudi et al. | 455/20 |
| 2004/0195917 A1 | * | 10/2004 | Rofougaran et al. | 307/109 |
| 2005/0056950 A1 | * | 3/2005 | Dornbusch et al. | 257/786 |
| 2005/0110674 A1 | * | 5/2005 | Mendolia et al. | 342/81 |
| 2007/0247147 A1 | * | 10/2007 | Xiang et al. | 324/300 |
| 2007/0275687 A1 | | 11/2007 | Forstner et al. | |
| 2008/0001810 A1 | | 1/2008 | Forstner et al. | |
| 2009/0010310 A1 | * | 1/2009 | Rofougaran et al. | 375/135 |

(Continued)

FOREIGN PATENT DOCUMENTS

WO 2007/038310 A 4/2007

OTHER PUBLICATIONS

Walker, C.A.; Pohlen, L.J.; Byloff, J.R.; , "Fault detection and isolation in RF subsystems," Aerospace and Electronics Conference, 1992. NAECON 1992., Proceedings of the IEEE 1992 National , vol., No., pp. 219-225 vol. 1, May 18-22, 1992.*

(Continued)

*Primary Examiner* — John Sotomayor
(74) *Attorney, Agent, or Firm* — Snell & Wilmer LLP

(57) ABSTRACT

Various techniques may be implemented to isolate a receive signal from a transmit signal in an antenna. Signal isolation is desirable because it prevents interference of the signals with one another and minimizes signal noise, which reduces the signal quality. Some of the techniques are symmetry of at least two receive channels with regards to a transmit channel, using differential signals within the antenna, designing receive channel inputs to be orthogonal to a transmit channel, and designing a voltage controlled oscillator to be on the same substrate as the tuning circuitry of the voltage controlled oscillator.

7 Claims, 8 Drawing Sheets

U.S. PATENT DOCUMENTS

2009/0195440 A1* 8/2009 Saunders .................. 342/175

OTHER PUBLICATIONS

Sinaga, S.M.; Polyakov, A.; Bartek, M.; Burghartz, J.N.; , "Circuit partitioning and RF isolation by through-substrate trenches," Electronic Components and Technology Conference, 2004. Proceedings. 54th , vol. 2, No., pp. 1519-1523 vol. 2, Jun. 1-4, 2004.*

The International Preliminary Report on Patentability (Ch. 1) from corresponding Int'l Application No. PCT/US09/032670 dated Aug. 12, 2010.

Invitation to Pay Additional Fees and, Where Applicable, Protest Fee with Communication Relating to the Results of the Partial International Search.

The International Search Report and Written Opinion issued in corresponding Int'l Application No. PCT/US09/032670 on Aug. 28, 2009.

* cited by examiner

HIGHLY INTEGRATED CIRCUIT ARCHITECTURE

RELATED APPLICATION

This application claims priority to U.S. Provisional Application 61/025,559, entitled "Highly Integrated Circuit Architecture", which was filed on Feb. 1, 2008, and is hereby incorporated by reference.

BACKGROUND OF THE INVENTION

Automotive radar products are typically made by assembling a number of discrete components on one or more printed circuit boards. Thus, automotive radar products are typically undesirably bulky. Moreover, existing automotive radar products tend to suffer from self-interference between a transmit signal and a receive signal of the radar device. To reduce the self-interference, radar product designs often incorporate several techniques that tend to increase the size and cost of the product. For example, the discrete components, or groups of discrete components, are somewhat isolated from each other by distance and/or other radio frequency (RF) isolation barriers configured to reduce the self-interference.

In traditional radar embodiments, and with reference to FIG. 1A, a transmitter and a receiver are made up of discrete components. Single signal lines connect the individual components to each other and a digital signal processor (DSP) module 110. Moreover, assembling discrete components results in an overall size increase in comparison to highly integrated circuit architecture.

Additionally, current narrowband frequency modulated continuous wave (FMCW) automotive radar products transmit a signal with a frequency ramp in discrete frequency steps. The discrete frequency steps are created using a digital-to-analog converter (DAC) integrated circuit 154 to tune a free-running voltage controlled oscillator (VCO) 101. With reference to FIG. 1B, the VCO 101 is typically built with a discrete GaAs FET and a discrete varactor diode. The DAC 154 is typically located on DSP module 110 and an analog tuning voltage control signal is communicated from the DSP module to an RF module 105 containing VCO 101. However, traversing a board-to-board connection makes the analog tuning voltage control signal more susceptible to noise. The source of tuning noise may be a PWM 152, DAC 154, an adder or summing circuit, or interface induced noise.

In this typical architecture of a board-to-board connection, DAC 154 is placed in close proximity to VCO 101 to limit noise coupling with the output of DAC 154. However, the proximity of DAC 154 to VCO 101 should also be limited due to digital noise from the DAC programming lines. The balancing of these two limitations commonly results in isolation of VCO 101 from DAC 154 using metal compartments, again causing the system to be larger and more costly.

Typically, making an automotive radar product smaller has the result of worsening the isolation between transmit and receive signals. Nevertheless, a need exists for a more compact radar embodiment having improved isolation of transmit and receive signals. This invention addresses these needs and others.

SUMMARY OF THE INVENTION

Various techniques may be implemented to isolate a receive signal from a transmit signal in an antenna. Signal isolation is desirable because it prevents interference of the signals with one another and minimizes signal noise, which reduces the signal quality. Some of the techniques are symmetry of at least two receive channels with regards to a transmit channel, using differential signals within the antenna, designing receive channel inputs to be orthogonal to a transmit channel, and designing a voltage controlled oscillator to be on the same substrate as the tuning circuitry of the voltage controlled oscillator.

In an exemplary embodiment, a signal isolation system includes a transmit channel with an axis of symmetry, at least two receive channels, where the receive channels are substantially symmetrical about the transmit channel's access of symmetry. Designing a symmetrical layout of transmit and receive channels is configured to improve the signal isolation in the system. In another exemplary embodiment, differential signaling is used in the isolation system to communicate various signals. The differential signaling may be used in a portion, or all of the receive and transmit channels.

In another exemplary embodiment, the tuning circuitry for a voltage controlled oscillator is placed on the MMIC, instead of a DSP as is typically done. Interference noise is reduced by using digital control signals between the DSP and tuning circuitry.

DETAILED DESCRIPTION

While exemplary embodiments are described herein in sufficient detail to enable those skilled in the art to practice the invention, it should be understood that other embodiments may be realized and that logical electrical and mechanical changes may be made without departing from the spirit and scope of the invention. Thus, the following detailed description is presented for purposes of illustration only.

Figure 2:
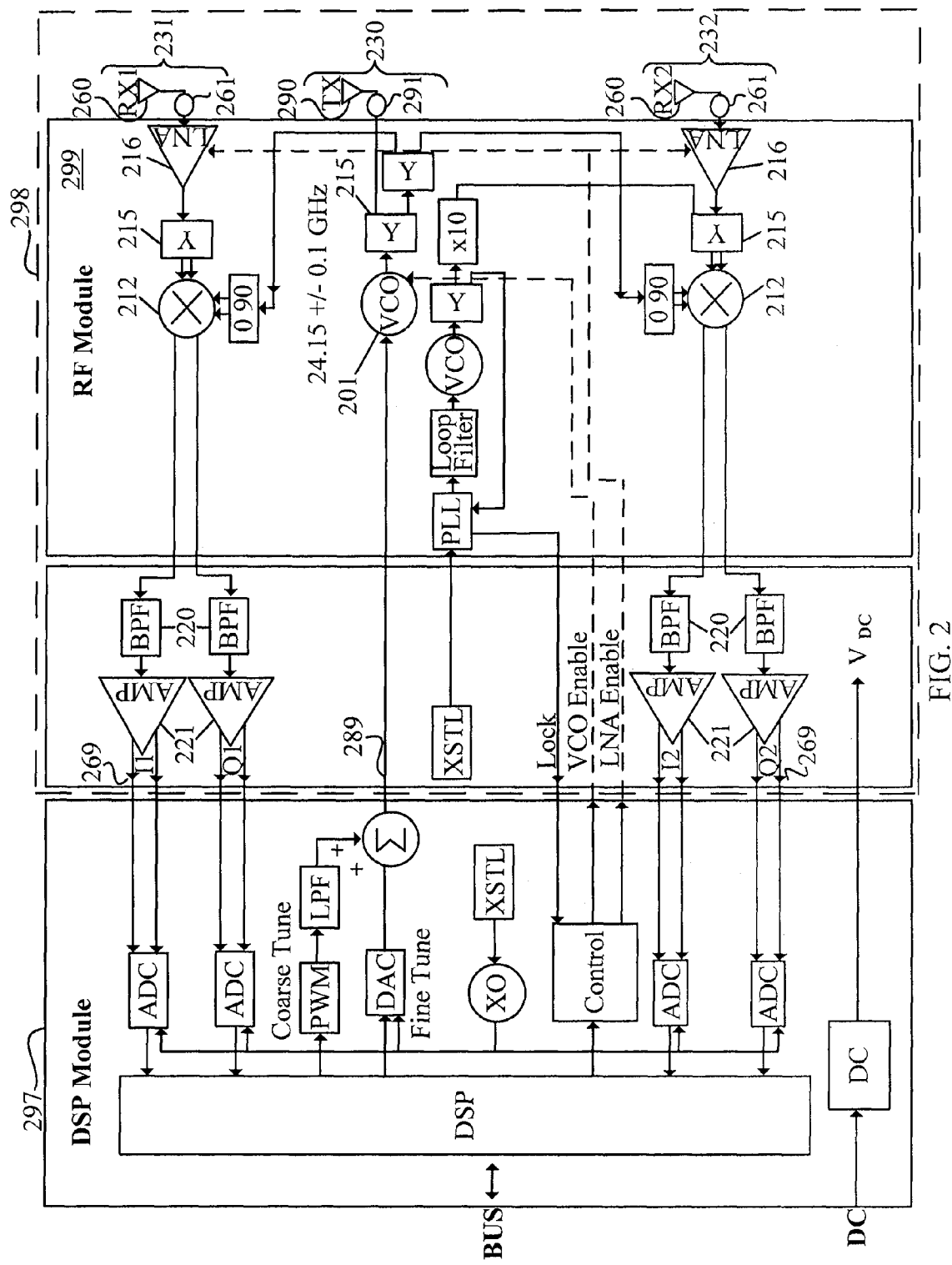
FIG. 2 shows an exemplary schematic of an integrated circuit utilizing differential signaling.

In accordance with an exemplary embodiment, a first technique for providing improved isolation of transmit and receive signals comprises the use of differential signal communication. In accordance with an exemplary embodiment, and with reference to FIG. 2, an integrated circuit (IC), such as a monolithic microwave integrated circuit (MMIC) 299 is located on a printed circuit board (PCB) 298, and is in communication with a digital signal processor (DSP) module 297. In an exemplary embodiment, MMIC 299 comprises a transmit channel 230, a first receive channel 231, and a second receive channel 232. More specifically, in an exemplary embodiment, transmit channel 230 comprises a transmit output node 290, a Balun 291, a splitter 215, and a VCO 201 in communication with tuning circuitry on the DSP module 297. Accordingly, transmit output node 290 is in communication with Balun 291 outside of MMIC 299, which in turn is in communication with splitter 215 and VCO 201. VCO 201 receives at least one signal from the tuning circuitry on DSP module 297. Furthermore, in the exemplary embodiment, first and second receive channels 231, 232 individually comprise a receive input node 260, a Balun 261, an LNA 216, a splitter 215, a mixer 212, a filter (or band pass filter) 220, and an amplifier 221. Receive input node 260 is in communication with Balun 261, which communicates a receive signal to LNA 216, splitter 215, and then to mixer 212. The receive signal is further communicated from mixer 212 to filter 220 and amplifier 221 before being transmitted to DSP module 297.

Isolation of the transmit and receive signals increases in response to transmitting signals using differential signaling. In accordance with an exemplary embodiment, the transmission path from receive output node(s) 269 to Balun 261 is configured for differential signal communication. In another exemplary embodiment, at least a portion of the receive channel is configured for differential signal mode communication of the receive signal. For example, the portion of the receive channel between power splitter 215 and Balun 261 may be configured for differential signal communication. In another example, differential signaling is present from Balun 261 to mixer 212. In another exemplary embodiment, differential signaling is present from Balun 261 to filter 220. In yet another exemplary embodiment, the portion of the transmission path from mixer 212 to receive output node(s) 269 is configured for differential signal communication.

In accordance with an exemplary embodiment, transmit channel 230 is configured to transmit a signal using differential signaling, from a transmit input node 289 to Balun 291. In another exemplary embodiment, at least a portion of transmit channel 230 is configured for differential signal communication of the transmit signal. For example, the transmission path between VCO 201 and Balun 291 may be configured for differential signaling. In another example, the portion of the transmission path between power splitter 215 and Balun 291 may be configured for differential signaling.

Thus, in accordance with various aspects of the present invention, the radar product is designed to implement both the receiver channels and the transmitter channel on the same MMIC. This tends to reduce the size and cost of the RF module, and consequently the overall system. Moreover, implementing both the receiver channels and the transmitter channel on the same MMIC facilitates an improvement in transmitter-to-receiver isolation, relative to a comparable device that does not employ differential signaling. Furthermore, although described herein in the context of a MMIC, in other exemplary embodiments, the components described herein may be discrete components because the implementation of similar differential signaling may be advantageous in a discrete component configuration.

Figure 6:
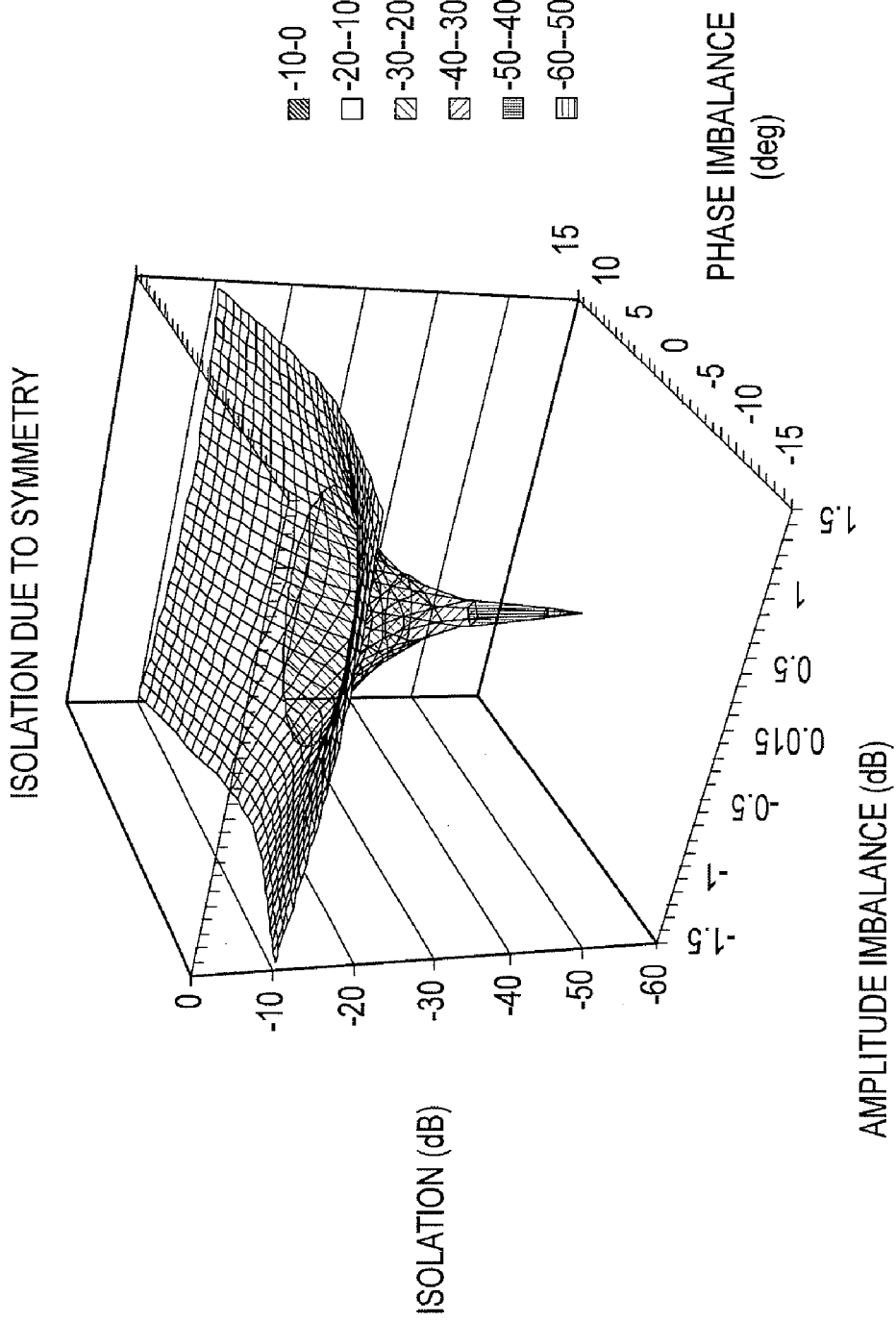
FIG. 6 shows a graphical representation of the signal isolation in an exemplary embodiment.

In an exemplary embodiment and as illustrated by the graph of FIG. 6, the use of differential signaling, in either a MMIC embodiment or a discrete component embodiment, improves the transmitter-to-receiver isolation by approximately 15 dB or greater relative to a similar RF module that does not use differential signaling. In other exemplary embodiments, the transmitter-to-receiver isolation improvement is 5 dB to 25 dB or more, in comparison to a similar RF module that uses single-ended signaling. In one exemplary embodiment, an absolute isolation of 45-55 dB is possible, which compares to a signal isolation of 30-40 dB in a similar RF module not using differential signaling.

Using differential signaling aids in controlling the interference between components. In accordance with an exemplary embodiment, differential signaling is accomplished by communicating complementary signals through at least two separate wires and then comparing the complementary signals. The radiation of electromagnetic energy is also reduced because the current in one line is equal and opposite of the current in the other differential line. In general, differential signaling improves isolation of the communicated signal by supporting removal of noise.

In an exemplary embodiment, various factors are configured to reduce interference between components, such as, the distance between the differential wires, and the length and/or diameter of the differential wires, and the frequency of the transmitted signal.

The spacing between the differential signal lines is small compared to the spacing between transmit and receive channels, therefore an equal amount of electromagnetic energy is imparted on both differential lines. The electromagnetic energy can be eliminated in the amplification stage if the voltage difference between the lines is amplified. In an exemplary embodiment, the longer the coupled lines, the better the signal isolation. Moreover, a transmission line effect is realized as the relationship between the signal frequency and the length of the coupled lines increases.

The isolation benefit of facilitating differential signaling increases as the transmitted signal frequency increases. In other words, the benefit is higher at high frequencies in comparison to low frequencies. In an exemplary embodiment, such isolation benefits are realized at signal frequencies exceeding 3 GHz. In another exemplary embodiment, isolation benefits are realized at signal frequencies exceeding 10 GHz.

In accordance with another exemplary embodiment, a second technique for providing improved isolation of transmit and receive signals comprises the use of symmetry. In an exemplary embodiment, and with reference to FIG. 4, a MMIC 400 includes a transmit channel 410, a first receive channel 420, and a second receive channel 430. Furthermore, in the exemplary embodiment, transmit channel 410 has at least one axis of symmetry, with transmit channel 410 being symmetrical about the transmitter axis. The axis of symmetry, for example, may be along the transmit channel.

Various configurations of the transmit and receive channels are possible. In an exemplary embodiment, receive channels 420, 430 are symmetrical about the transmitter axis. In one embodiment, receive channels 420, 430 are on opposite sides of the transmitter axis. In a second exemplary embodiment, receive channels 420, 430 are equally spaced on opposite sides of the transmitter axis and approximately mirror one another.

Furthermore, in an exemplary embodiment, receive channels 420, 430 each have the same components and layout. Each part or point of the receive channel may be described as having a corresponding part or point in the other receive channel. In an exemplary embodiment, the receive channels, in general, are symmetrical to each other about the transmitter axis. In another exemplary embodiment, a point of first receive channel 420 and the corresponding point of second receive channel 430 are equidistant from the transmitter axis.

In accordance with an exemplary embodiment, the symmetry between transmit channel 410 and receive channels 420, 430 is perfect. In other words, each point and corresponding point of the receive channels are symmetrical to each other about the transmitter axis. In another exemplary embodiment, the symmetry between transmit channel 410 and receive channels 420, 430 is less than perfect, and the benefit of symmetry degrades as a function of distance. For example, not all points and corresponding points of the receive channels are symmetrical to each other. That is, as the receive channels become less symmetrical, the first receive signal's amplitude and phase begin to differ from the second receive signal. As illustrated by FIG. 6, signal isolation is highest as the receive signals' amplitude and phase cancel each other. However, increases in the pairs of receive channel points that are symmetrical results in higher signal isolation benefit; though not all receive channel points have an equal effect on isolation.

In an exemplary embodiment, the portions of the receive channels where the receive signal frequency is identical, or approximately the same, to the transmit signal frequency are the portions where a symmetrical configuration yields the most benefit for signal isolation. The receive signal frequency and the transmit signal frequency are considered approximately the same if the two frequencies are within 10% of each other. For example, if the transmit signal frequency is 20 GHz, then a receive signal frequency in the range of 18 GHz to 22 GHz is approximately the same for improved signal isolation using symmetry.

Figure 4:
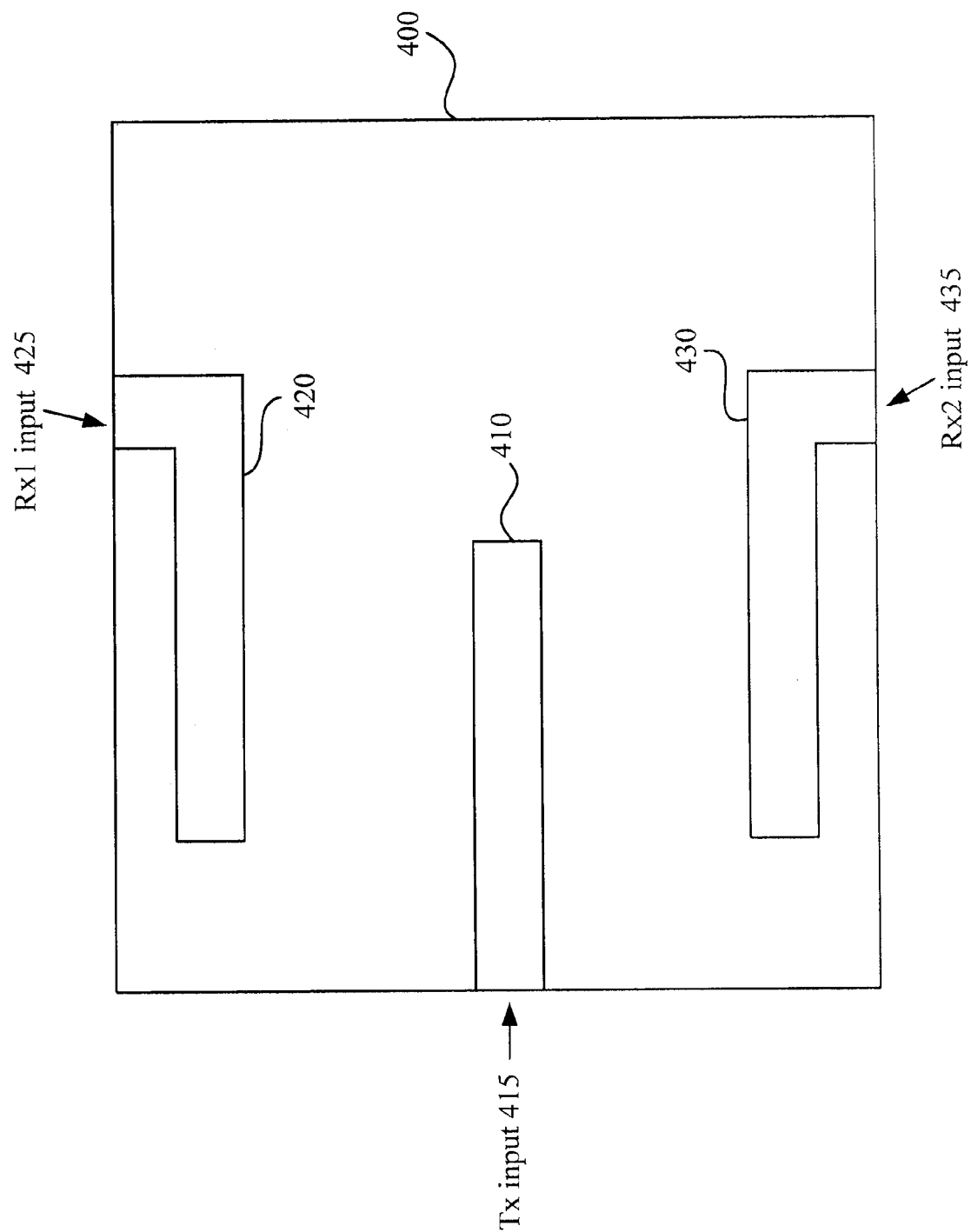
FIG. 4 shows an example of a symmetric integrated circuit layout.

With momentary reference to FIG. 4, an example of such a receive channel portion is an input portion 425 of first receive channel 420, and an input portion 435 of second receive channel 430. In an exemplary embodiment, the input portion of a receiver channel is the portion from the receiver input node to the associated Balun, where the received signal is converted to a differential signal. Thus, in an exemplary embodiment, the input portions of the receive channels are configured symmetrically about the transmit channel.

Another important area of symmetry exists where a signal is transmitted in a single line as opposed to a differential signal. Thus, it is beneficial to design a layout such that portions comprising a single line are symmetric. Furthermore, in an exemplary embodiment, differential signaling and symmetry are used in areas of a MMIC where the receive signals and the transmit signal are communicated at similar frequencies, for example at the final carrier frequency.

A MMIC configured with two receivers placed equal distances from the transmitter results in system improvement because the leakage to both receivers will be nearly identical and therefore more easily removed in subsequent signal processing. The larger the difference between the absolute distance from the transmit channel to a first receive channel in comparison to the absolute distance from the transmit channel to a second receive channel, the more difficult is it to remove signal leakage. This relationship can be described as: (Tx–Rx1:Tx–Rx2). Thus, as the asymmetry of the layout increases, the isolation benefit decreases. In an exemplary embodiment, a beneficial signal isolation is 40 dB or higher.

In accordance with another exemplary embodiment and with continued reference to FIG. 4, a third technique for providing improved signal isolation comprises designing first receive input 425 and second receive input 435 approximately orthogonally orientated to transmit input 415. Designing first and second receive inputs 425, 435 to be orientated substantially 90 degrees from transmit input 415, reduces the electrical field interference of the receive inputs and transmit input with each other. Although illustrated in block format in FIG. 4, examples of the aforementioned symmetry can also be seen in FIG. 5, where the receive channels are communicated to the MMIC at approximately 90 degrees from the transmit channel.

Figure 1A:
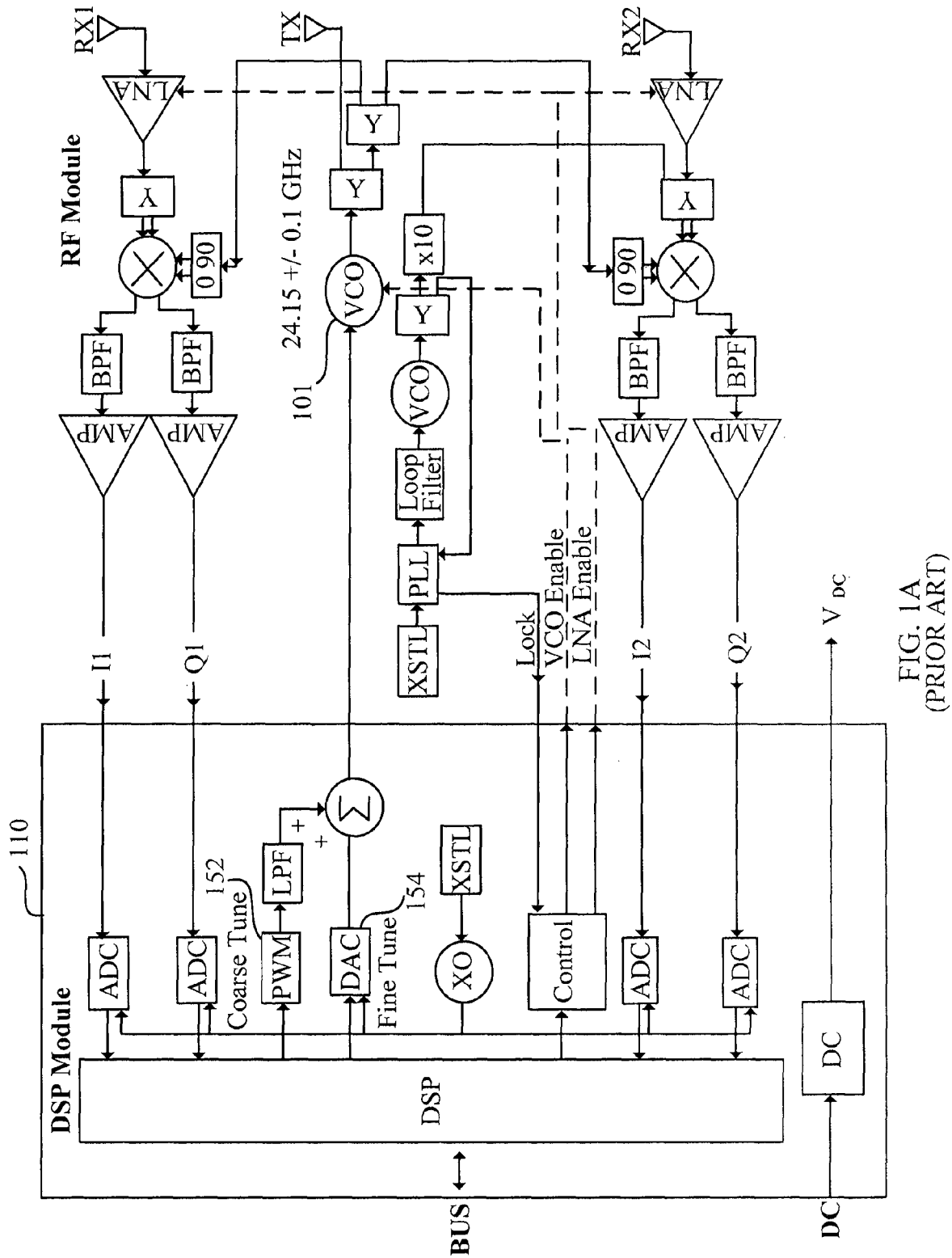
FIGS. 1A-1B show examples of a prior art schematic of a discrete transceiver circuit.
Figure 1B:
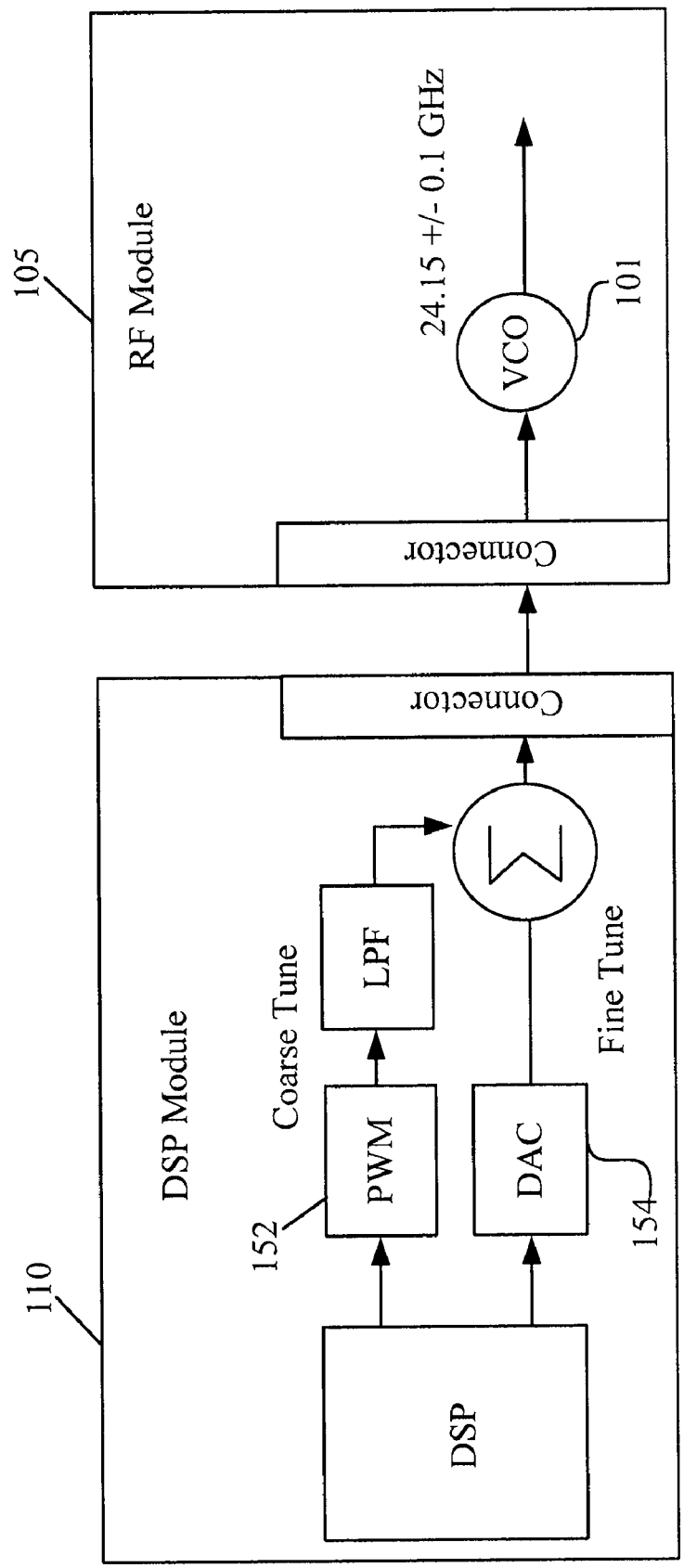
Figure 3A:
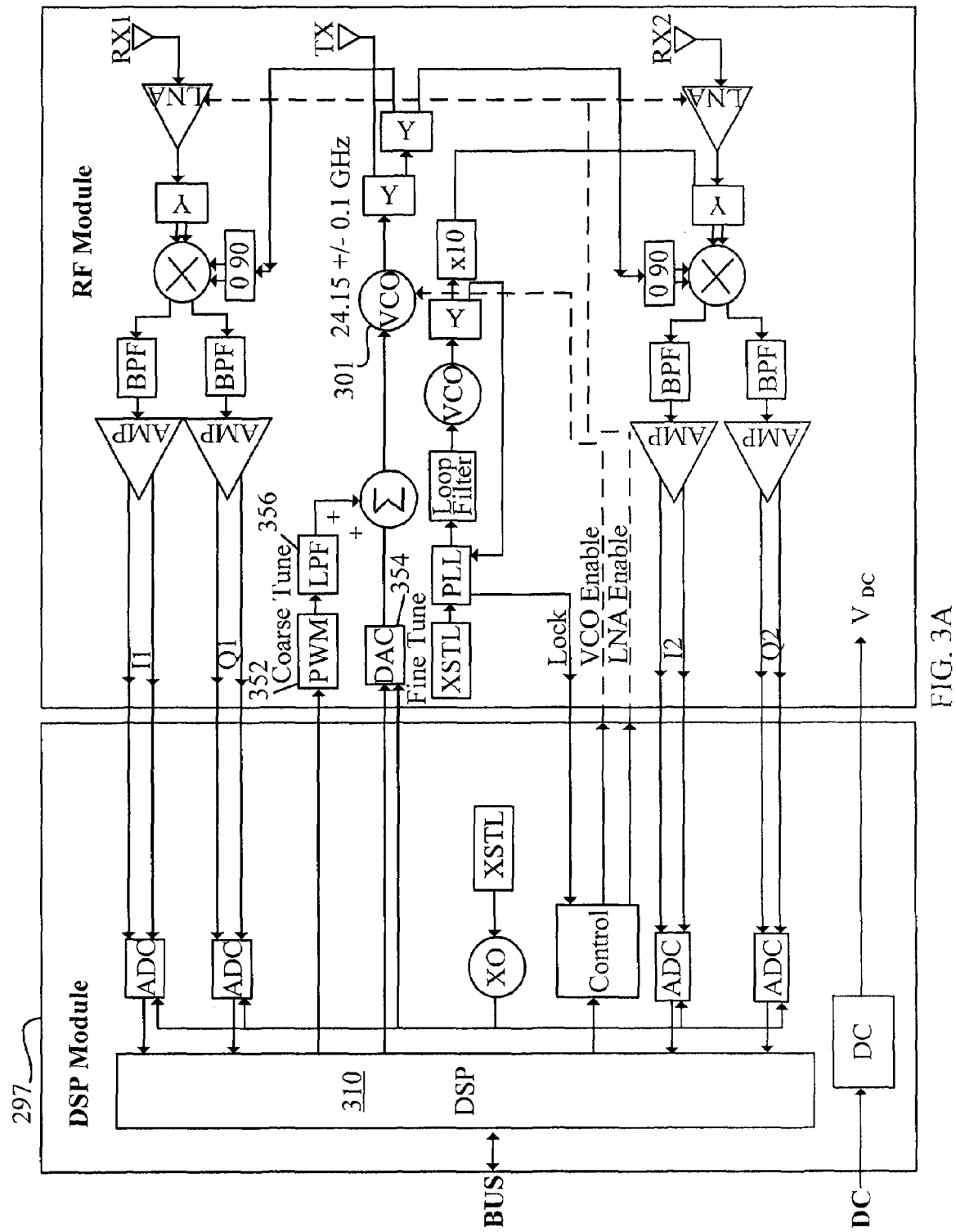
FIGS. 3A-3B show examples of an integrated voltage controlled oscillator tuning architecture.
Figure 3B:
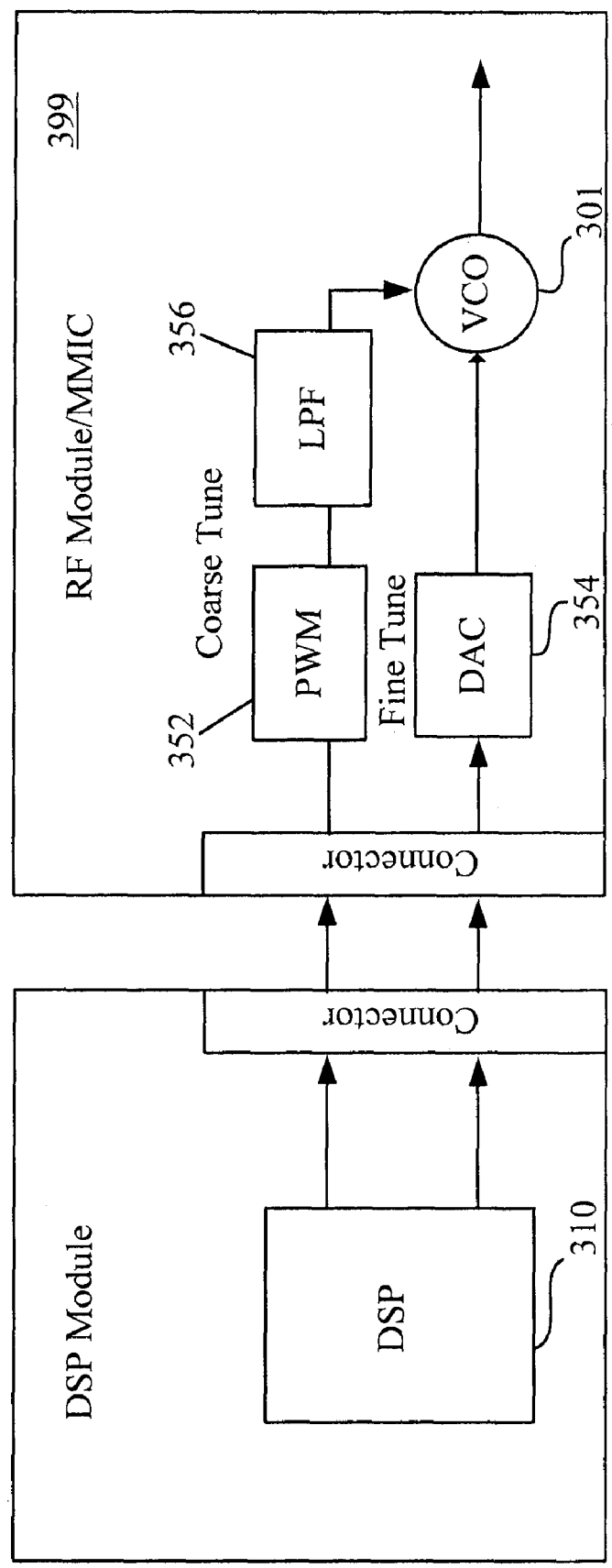

In accordance with another exemplary embodiment, a fourth technique for providing improved isolation of transmit and receive signals comprises designing a tuning circuit on an integrated circuit for tuning a VCO. With reference to FIG. 1B, in the prior art, one manner of tuning a VCO 101 involves VCO tuning circuitry on DSP module 110 comprising a pulse width modulator (PWM) 152 and DAC 154. In accordance with an exemplary embodiment, this tuning function is moved on-chip. In the exemplary embodiment, and with reference to FIG. 3A-3B, the tuning circuitry providing a tuning voltage to a VCO and a VCO are integrated on the same printed circuit board. In another exemplary embodiment, a VCO tuning circuitry and a VCO are integrated in a radar embodiment of a MMIC 399.

In an exemplary embodiment, VCO tuning circuitry includes a pulse width modulator (PWM) 352 and a DAC 354. The VCO tuning circuitry may also comprise a low-pass filter (LPF) 356. PWM 352 connects to a DSP 310 and receives a digital signal as an input signal. The output of PWM 352 connects to a VCO 301 and PWM 352 is configured to control the coarse tuning portion of the VCO tuning circuitry. In an exemplary embodiment, PWM 352 comprises a group of parallel capacitors with switches to adjust resonant frequency and is configured to perform coarse tuning on-chip. Furthermore, any suitable device(s) that perform coarse tuning on-chip may be used.

In one embodiment, DAC 354 also connects to DSP 310 and receives a digital signal as an input signal. The output of DAC 354 is in communication with VCO 301 and DAC 354 is configured to control the fine tuning portion of the VCO tuning circuitry. In another exemplary embodiment, DAC 354 comprises a varactor diode and is configured is control the fine tuning accomplished by adjusting a varactor diode voltage supplied by DAC 354. Furthermore, in an exemplary embodiment, DAC 354 is isolated from VCO 301 by n-wells.

In accordance with an exemplary embodiment, designing a digital interface by placing the VCO tuning circuitry on-chip improves the chip performance by reducing the susceptibility of the VCO tuning voltage to noise at the transmission interface. In an exemplary embodiment and in contrast to the prior art, the source of tuning noise is no longer PWM 352, an adder or summing circuit, or any interface induced noise. The remaining source of tuning noise is DAC 354. The VCO is less susceptible to tuning noise because the transmit signal can remain digital as it moves from board-to-board. Thus, in an exemplary embodiment, VCO tuning control signals are communicated to MMIC 399 in a digital signal form.

Furthermore, in accordance with an exemplary embodiment, signal interference due to tuning is further reduced in response to the digital VCO tuning control signal being turned off when not used, in comparison to a continuous analog signal. Since VCO 301 is not continuously tuned, the digital VCO tuning control signal does not need to be continuously transmitted. In other words, in an exemplary embodiment, the digital VCO tuning control signal is received at VCO 301 in a non-continuous or periodic manner. If the digital VCO tuning control signal is not transmitted, the possibility of signal interference with at least one of the transmit signal or the receive signal(s) is reduced.

In an exemplary embodiment, no filter is present between DSP 310 and DAC 354 located on MMIC 399. In the exemplary embodiment, the use of digital signals does not require filtering, and signals are transmitted from DSP 310 to MMIC 399 faster than analog signals that are filtered on DSP 310 before transmission to MMIC 399. In another exemplary embodiment, DSP 310 can chirp signals without any latency effect from transmission. A chirp is a signal in which the frequency increases or decreases with time, and is a well-known concept in the art.

Figure 5:
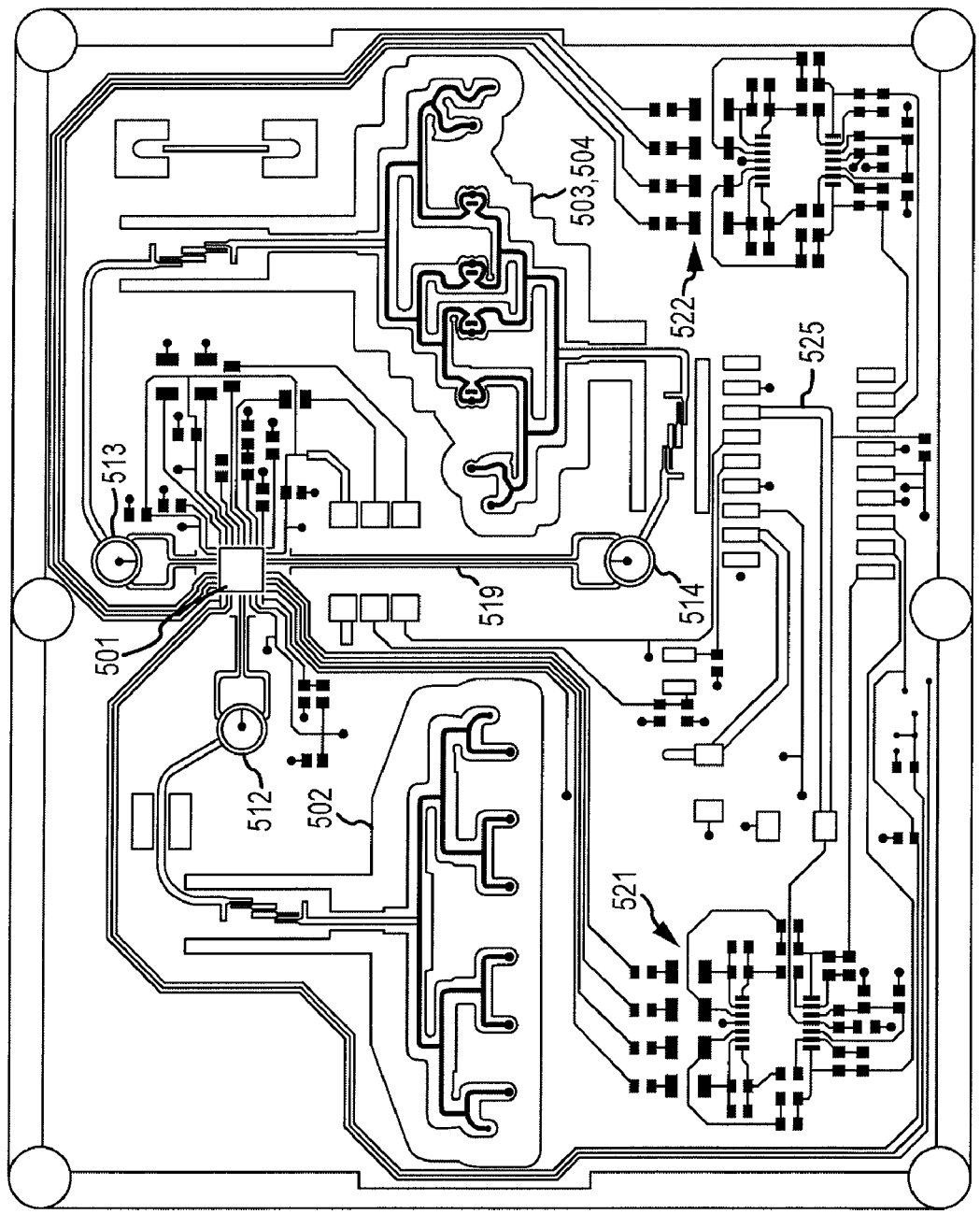
FIG. 5 shows an exemplary PCB and MMIC layout.

In an exemplary embodiment, and with reference to FIG. 5, an IC phase noise performance and receiver balance are greatly improved due to implementing multiple transmit, receive, and frequency tuning techniques in a single IC. In an exemplary embodiment, the techniques include at least one of using differential signaling, designing a symmetrical layout of a transmitter and two receivers, designing the receive channel inputs to be orthogonal to the transmit channel, and integrating VCO tuning circuitry on the same IC as a VCO. By using at least one of these techniques, an IC may be configured to reduce signal interference and operate more effectively.

FIG. 5 illustrates an exemplary printed circuit board layout and some of the various techniques described above. For example, a MMIC 501 communicates with a transmit portion 502, and two receive portions 503, 504. The signals passing through transmit portion 502 and receive portions 503, 504 are communicated in part using differential signaling 519 between MMIC 501 and Baluns 512-514. Furthermore, FIG. 5 illustrates the receive inputs of MMIC 501 configured orthogonally to the transmit input.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

The invention claimed is:

1. A voltage-controlled oscillator (VCO) tuning circuit comprising:
   a pulse-width modulator (PWM) configured to provide coarse tuning of a voltage-controlled oscillator (VCO);
   a digital-to-analog converter (DAC) configured to provide fine tuning of the VCO;
   wherein the VCO, the PWM, and the DAC are located on a substrate of an integrated circuit; and
   wherein the VCO tuning circuit receives a digital tuning control signal from a digital signal processor that is not located on the same substrate as the VCO.

2. The VCO tuning circuit of claim 1, further comprising n-wells to isolate the DAC from the VCO, and wherein the DAC drives a varactor diode.

3. The VCO tuning circuit of claim 1, wherein the digital tuning control signal is a non-continuous digital input signal, and wherein the digital signal processor is configured to chirp the digital tuning control signal without substantial latency.

4. The VCO tuning circuit of claim 1, wherein the integrated circuit is at least one of a MMIC and a radar chip.

5. The VCO tuning circuit of claim 4, wherein the integrated circuit comprises:
   a transmit channel with an axis of symmetry;
   two receiver channels; and
   wherein at least one of the transmit channel and the two receive channels at least partially comprise coupled differential lines communicating a differential signal;
   wherein the two receiver channels are spaced symmetrically about the axis of symmetry of the transmitter channel.

6. The VCO tuning circuit of claim 5, wherein the plurality of coupled differential lines provides isolation of 40 dB or more between a transmit signal and a receive signal.

7. The VCO tuning circuit of claim 5, wherein the two receiver channels individually comprise a receiver input that is approximately orthogonal with the axis of symmetry of the transmitter channel, and wherein the axis of symmetry of the transmit channel is along the length of the transmitter.

* * * * *